United States Patent [19]

Wu

[11] Patent Number: 6,144,059
[45] Date of Patent: Nov. 7, 2000

[54] PROCESS AND STRUCTURE FOR INCREASING CAPACITANCE OF STACK CAPACITOR

[75] Inventor: Chung-Cheng Wu, I-Lan, Taiwan

[73] Assignee: Mosel Vitelic, Inc., Taiwan

[21] Appl. No.: 09/375,638

[22] Filed: Aug. 17, 1999

Related U.S. Application Data

[62] Division of application No. 08/706,652, Oct. 7, 1996, Pat. No. 6,069,052.

[51] Int. Cl.⁷ .................................................. H01L 27/108
[52] U.S. Cl. ............................................ 257/309; 257/534
[58] Field of Search .................................. 257/532, 534, 257/306, 309; 438/239, 253, 255, 396, 398, 674

[56] References Cited

U.S. PATENT DOCUMENTS

| | | | |
|---|---|---|---|
| 5,102,832 | 4/1992 | Tuttle | 438/398 |
| 5,108,943 | 4/1992 | Sandhu et al. | 438/254 |
| 5,124,767 | 6/1992 | Koyama | 257/309 |
| 5,244,842 | 9/1993 | Cathey et al. | 438/398 |
| 5,302,844 | 4/1994 | Mizuno et al. | 257/306 |
| 5,639,689 | 6/1997 | Woo | 438/398 |
| 5,700,710 | 12/1997 | Zenke | 438/398 |
| 5,759,895 | 6/1998 | Tseng | 438/255 |
| 5,773,342 | 6/1998 | Fukase | 438/255 |
| 5,885,882 | 3/1999 | Schugraf et al. | 438/398 |
| 6,015,983 | 2/2000 | Parekh | 257/296 |

OTHER PUBLICATIONS

Wolf et al., *Chemical Vapor Deposition of Amorphous and Polycrystalline Films*, Silicon Processing the VLSI Era: Process Technology–vol. 1, pp. 182–185.

Wolf et al., *Dry Etching for VLSI Fabrication*, Silicon Processing for the VLSI Era: Process Technology (vol. 1), pp. 540–541.

*Primary Examiner*—Carl Whitehead, Jr.
*Assistant Examiner*—Jeff Vockrodt
*Attorney, Agent, or Firm*—Madson & Metcalf

[57] ABSTRACT

The present invention provides a process and a structure for increasing a capacitance of a stack capacitor. The process includes steps of: a) forming a contact hole on a silicon substrate having an oxide layer, b) forming a polysilicon contact plug of a first polysilicon layer in the contact hole; c) forming a second gibbous polysilicon layer on a surface of the contact plug, and d) forming a third polysilicon layer above the gibbous polysilicon layer and a portion of the oxide layer to form the stack capacitor, wherein the gibbous polysilicon layer increases the capacitance of the stack capacitor.

4 Claims, 5 Drawing Sheets

PROCESS AND STRUCTURE FOR INCREASING CAPACITANCE OF STACK CAPACITOR

This is a divisional to U.S. patent application Ser. No. 08/706,652 filed Oct. 7, 1996, now U.S. Pat. No. 6,069,052.

FIELD OF THE INVENTION

The present invention relates to a process and a structure for increasing a capacitance of a stack capacitor, especially to a process and a structure for increasing a capacitance of a stack capacitor of a dynamic random access memory (DRAM).

BACKGROUND OF THE INVENTION

A conventional structure for forming a stack capacitor in a 16 MB DRAM is a rugged polysilicon layer having a thickness of about 850 Å. Usually, the rugged polysilicon is formed on an upper surface of the other polysilicon layer having contact holes, and the wall of the contact holes, by a low pressure chemical vapor deposition (LPCVD). The stack capacitor will be constructed on the surface of the rugged polysilicon layer.

To reduce costs, the radius of a wafer is reduced and the number of integrated circuits on a wafer is increased in a semiconductor manufacture process. Unfortunately, when the wire size in a semiconductor manufacture process is reduced from 0.45 µm to 0.38 µm or less, a serious problem for the conventional technique of forming the stack capacitor on the DRAM will occur. That is, to maintain the capacitance of the stack capacitor structure, the thickness of the rugged polysilicon layer must be increased to enlarge the surface area of the stack capacitor structure. However, the added rugged polysilicon will fill up the contact hole and therefore reduce the overall surface of the rugged polysilicon layer instead of increasing it. In other words, the capacitance of the stack capacitor is insufficient in a 0.38 µm or less wire size semiconductor manufacture process on which the conventional technique of forming the rugged polysilicon layer is applied.

For the above reason, it is desirable to invent a process and a structure for a 0.38 µm or less wire size semiconductor manufacture process to maintain the capacitance of the stack capacitor of a DRAM. It is then attempted by the applicant to design such a process and such a structure.

SUMMARY OF THE INVENTION

An object of the present invention is to provide a semiconductor manufacture process which can increase the capacitance of a stack capacitor by enlarging the surface of the polysilicon layer.

The other object of the present invention is to provide a semiconductor structure for increasing the capacitance of a stack capacitor by enlarging the surface of the polysilicon layer.

The present invention provides a process for increasing a capacitance of a stack capacitor including steps of: a) forming a contact hole on a silicon substrate having an oxide layer; b) forming a polysilicon contact plug of a first polysilicon layer in the contact hole; c) forming a second polysilicon layer in a gibbous shape on a surface of the contact plug; and d) forming a third polysilicon layer above the gibbous polysilicon layer and a portion of the oxide layer to form the stack capacitor, wherein the capacitance of the stack capacitor is increased by the gibbous polysilicon layer.

In accordance with one aspect of the present invention, the oxide layer is preferably a silicon dioxide ($SiO_2$) layer. The oxide layer is preferably formed by a chemical vapor deposition (CVD). Especially, it is preferably formed by a low pressure chemical vapor deposition (LPCVD).

In accordance with another aspect of the present invention, the step a) preferably includes steps of: a1) forming a photoresistant layer above the oxide layer; a2) defining a contact hole pattern on the photoresistant layer; a3) removing a portion of the photoresistant layer according to the contact hole pattern to expose a portion of the oxide layer, and etching the portion of the oxide layer to form the contact hole; and a4) removing a remaining portion of the photoresistant layer.

In accordance with another aspect of the present invention, the oxide layer is preferably etched by a dry etching. More particularly, the dry etching is preferably a sputtering etching, a plasma etching, or a reactive ion etching.

In accordance with another aspect of the present invention, the first polysilicon layer and the third polysilicon layer are preferably formed by an LPCVD.

In accordance with another aspect of the present invention, the first polysilicon layer is preferably firstly formed in the contact hole and above the oxide layer, and is then preferably removed except a portion in the contact hole to form the contact plug.

In accordance with another aspect of the present invention, the second polysilicon is preferably formed by a selective growth method of polysilicon selectively growing a polysilicon only on a polysilicon layer.

The second polysilicon is preferably selectively grown at a temperature ranged from about 800° C. to 1000° C. and under a pressure of about 100 Pa, and preferably has a thickness having a range from about 500 Å to 5000 Å.

In accordance with another aspect of the present invention, the third polysilicon layer is preferably a rugged polysilicon layer.

In accordance with another aspect of the present invention, the third polysilicon layer preferably has a thickness having a range from about 300 Å to about 1000 Å.

In accordance with another aspect of the present invention, the third polysilicon layer is preferably formed at a temperature from about 500° C. to about 600° C.

In accordance with another aspect of the present invention, the process preferably further includes steps of: e) defining a stack capacitor area pattern on the third polysilicon layer; and f) etching a portion of the third polysilicon layer for obtaining the stack capacitor area.

In accordance with another aspect of the present invention, the stack capacitor area pattern is preferably formed by a photolithography.

In accordance with another aspect of the present invention, another process for increasing a capacitance of a stack capacitor includes steps of: a) forming a contact hole on a silicon substrate having an oxide layer; b) forming a polysilicon contact plug of a first polysilicon layer in the contact hole; c) forming a second polysilicon layer in a gibbous shape on a surface of the contact plug; d) forming a third polysilicon layer above the gibbous polysilicon layer and a portion of the oxide layer; and e) forming a fourth polysilicon layer above the third polysilicon to form the stack capacitor, wherein the capacitance of the stack capacitor is increased by the gibbous polysilicon layer.

In accordance with another aspect of the present invention, the first polysilicon layer, the third polysilicon layer and the fourth polysilicon layer are preferably formed by an LPCVD.

In accordance with another aspect of the present invention, the second polysilicon is preferably formed by a selective growth method of polysilicon selectively growing a polysilicon only on a polysilicon layer.

The second polysilicon is preferably selectively grown at a temperature having a range from about 800° C. to 1000° C. and under a pressure of about 100 Pa, and preferably has a thickness having a range from about 500 Å to 5000 Å.

In accordance with another aspect of the present invention, the third polysilicon layer is preferably a normal polysilicon layer.

In accordance with another aspect of the present invention, the fourth polysilicon layer is preferably a rugged polysilicon layer.

In accordance with another aspect of the present invention, the fourth polysilicon layer preferably has a thickness having a range from about 300 Å to about 1000 Å.

In accordance with another aspect of the present invention, the fourth polysilicon layer is preferably formed at a temperature from about 500° C. to about 600° C.

In accordance with another aspect of the present invention, the process further includes steps of: f) defining a stack capacitor area pattern on the fourth polysilicon layer; and g) respectively etching portions of the fourth polysilicon layer and the third polysilicon layer for obtaining the stack capacitor area.

The present invention further provides a structure for increasing a capacitance of a stack capacitor on a silicon substrate including: the silicon substrate, an oxide layer formed on the silicon substrate and provided with a contact hole, a first polysilicon layer forming a contact plug in the contact hole and having a gibbous surface on a surface of the contact plug, and a second polysilicon layer formed above the gibbous surface of the contact plug to form the stack capacitor, wherein the second polysilicon layer on the gibbous surface of the contact plug increases the capacitance of the stack capacitor.

In accordance with another aspect of the present invention, the oxide layer is preferably a silicon dioxide layer.

In accordance with another aspect of the present invention, the gibbous surface of the contact plug preferably has a thickness having a range from about 500 Å to 5000 Å.

In accordance with another aspect of the present invention, the second polysilicon layer is preferably a rugged polysilicon layer.

In accordance with another aspect of the present invention, the second polysilicon layer preferably has a thickness having a range from about 300 Å to about 1000 Å.

The present invention may best be understood through the following description with reference to the accompanying drawings, in which:

DETAILED DESCRIPTION OF THE PREFERRED EMBODIMENTS

Figure 1:
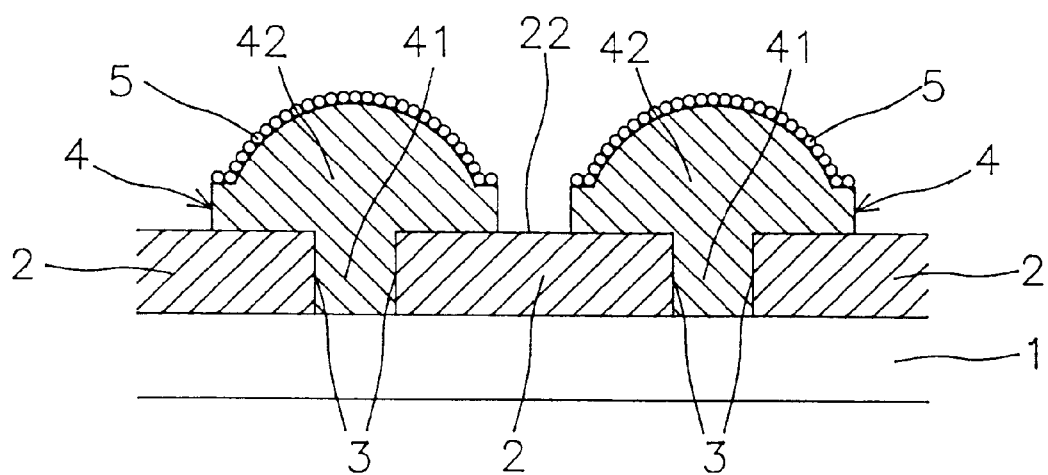
FIG. 1 is a schematic illustration of a preferred embodiment of a structure according to the present invention.

Referring to FIG. 1, which indicates a semiconductor structure including a silicon substrate 1, an oxide layer 2, a contact hole 3, a first polysilicon region 4 and a second polysilicon region 5. The oxide layer 2 is a silicon dioxide layer, and the second polysilicon region 5 is a rugged polysilicon layer.

The silicon dioxide layer 2 is formed over the silicon substrate 1, and the contact holes 3 are provided within the oxide layer 2. Furthermore, the first polysilicon layer 4 is distributed in the contact hole 3 and a portion of the oxide layer 2 around the contact hole 3. The first polysilicon layer 4 in the contact hole 3 constructs the contact plug 41, and the top surface of the polysilicon layer 4 has a gibbous shape. The polysilicon layer on the gibbous surface has a thickness of about 500 Å to 5000 Å. Furthermore, the rugged polysilicon layer 5 having a thickness of about 300 Å to 1000 Å is distributed over the gibbous polysilicon layer 42. The gibbous surfaced polysilicon region 42 enlarges the surface area of the rugged polysilicon layer 5, thus increases the capacitance of the stack capacitor.

FIGS. 2(a)~2(e) illustrate a preferred embodiment of a process for forming the stack capacitor according to the present invention.

Figure 2A:
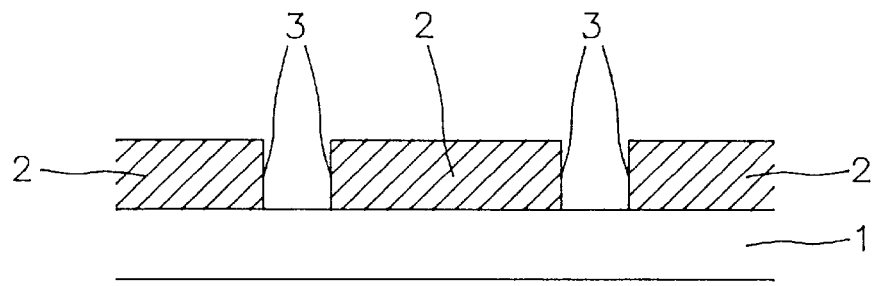
FIGS. 2(a)~2(e) schematically illustrate a preferred embodiment of a process according to the present invention.

FIG. 2(a) includes steps of:

forming a silicon dioxide layer 2 over the silicon substrate 1 by a chemical vapor deposition (CVD), or, a low pressure chemical vapor deposition (LPCVD);

forming a photoresist layer (not shown) over the silicon dioxide layer 2;

defining a contact hole pattern on the photoresist layer;

removing the photoresist layer according to the contact hole pattern, and etching the exposed silicon dioxide layer to form the contact hole 3 by a dry etching method such as a sputtering etching, a plasma etching or a reactive ion etching; and removing the remaining photoresist layer.

Figure 2B:
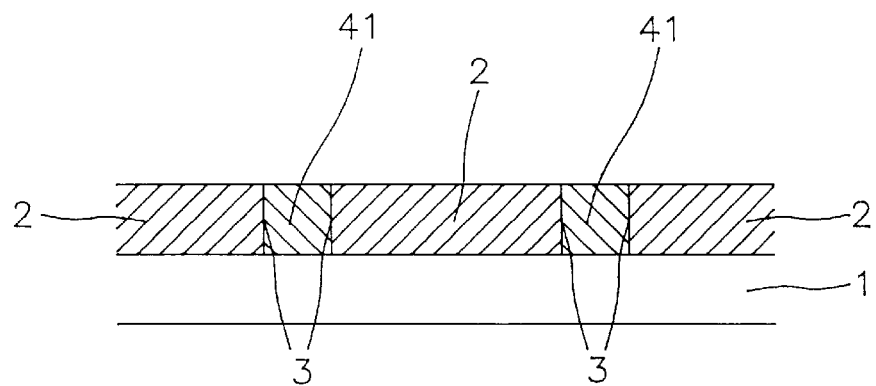

FIG. 2(b) includes steps of:

forming a first polysilicon layer in the contact hole 3 and over the silicon dioxide layer 2; and removing the first polysilicon layer on the silicon dioxide layer 2 and maintaining the one in the contact hole 3 to form the contact plug 41.

Figure 2C:
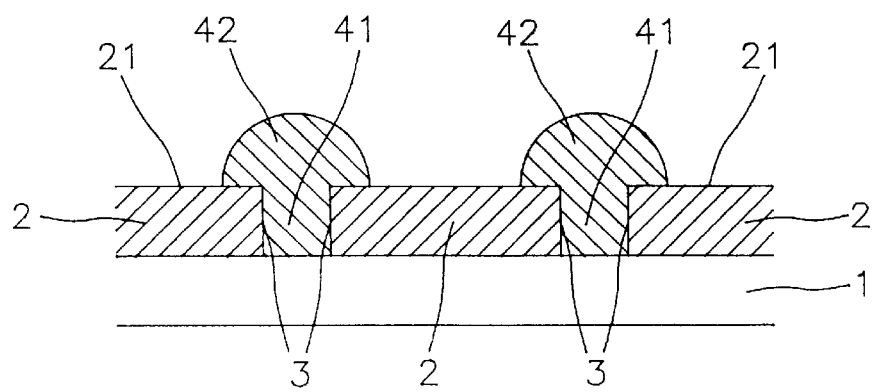

FIG. 2(c) includes a step of:

forming a second polysilicon layer 42 having a thickness of about 500 Å to 5000 Å over the top surface of the polysilicon contact plug 41. The second polysilicon layer has a gibbous surface, and is formed by a selective growth of polysilicon at a temperature ranged from about 800° C. to 1000° C. and under a pressure of about 100 Pa. The selective growth of the polysilicon ensures that the second polysilicon layer will not grow on the region 21 of the silicon dioxide 2.

Figure 2D:
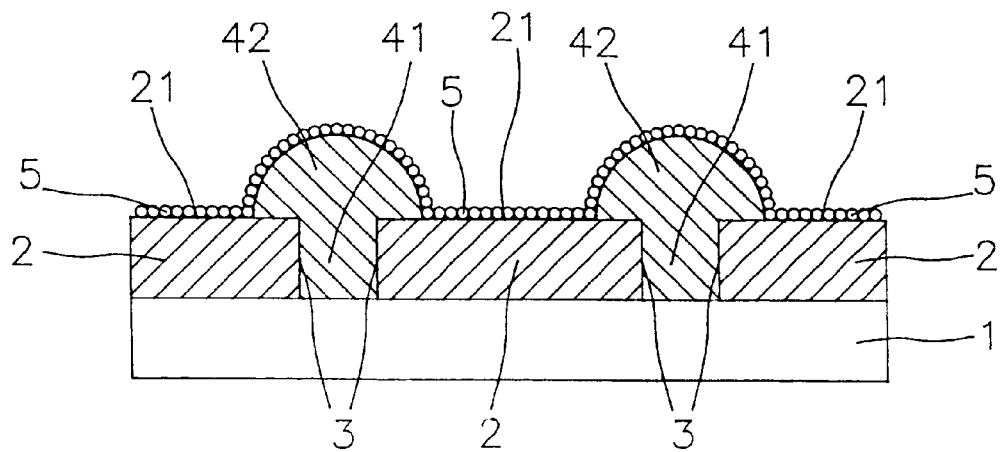

FIG. 2(d) includes a step of:

forming a rugged polysilicon layer 5 over the second polysilicon layer 42 and the region 21 of the oxide layer 2 by an LPCVD at a temperature ranged from about 500° C. to 600° C.

Figure 2E:
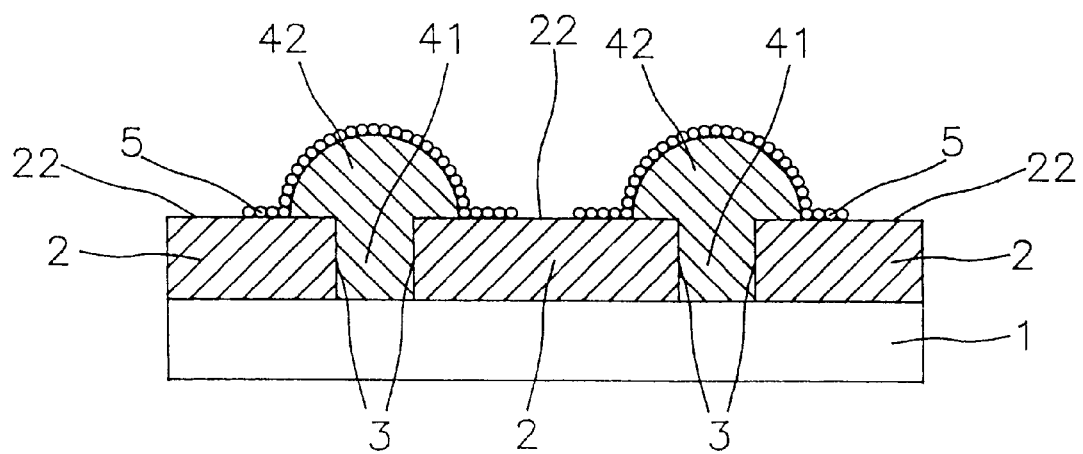

FIG. 2(e) includes steps of:

defining a stack-capacitor pattern on the rugged polysilicon layer 5 by a photolithography technique; and etching the rugged polysilicon layer 5 to expose the region 22 of the silicon dioxide 2. The gibbous surface of the polysilicon layer 42 will increase the surface area of the rugged polysilicon layer 5 and thus raise the capacitance of the stack capacitor.

FIGS. 3(a)~3(f) illustrate another preferred embodiment of a process for forming the stack capacitor according to the present invention.

Figure 3A:
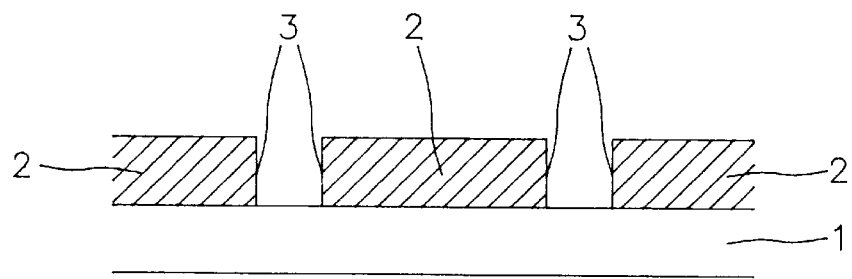
FIGS. 3(a)~3(f) schematically illustrate another preferred embodiment of a process according to the present invention.

FIG. 3(a) includes steps of:

forming an silicon dioxide layer 2 over the silicon substrate 1 by a chemical vapor deposition (CVD), or a low pressure chemical vapor deposition (LPCVD);

forming a photoresist layer (not shown) over the silicon dioxide layer 2;

defining a contact hole 3 pattern on the photoresist layer;

removing the photoresist layer which is under the contact hole pattern, and etching the exposed silicon dioxide layer to form the contact hole 3 by a dry etching method such as a sputtering etching, a plasma etching or a reactive ion etching; and removing the remaining photoresist layer.

Figure 3B:
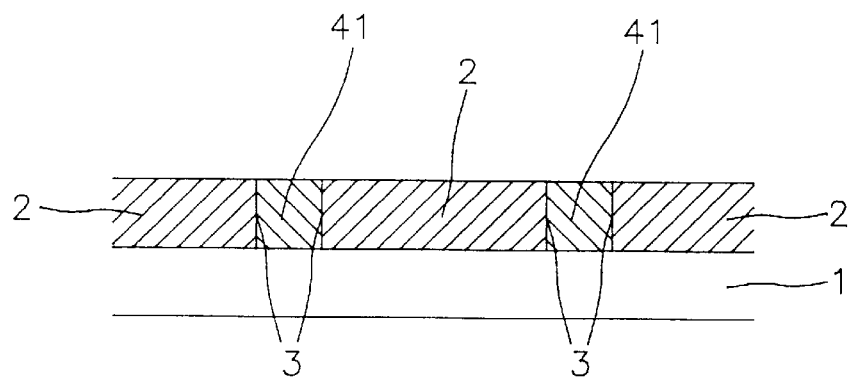

FIG. 3(b) includes steps of:

forming a first polysilicon layer in the contact hole 3 and over the silicon dioxide layer 2; and removing the first polysilicon layer on the silicon dioxide layer 2 and maintaining the one in the contact hole 3 to form the contact plug 41.

Figure 3C:
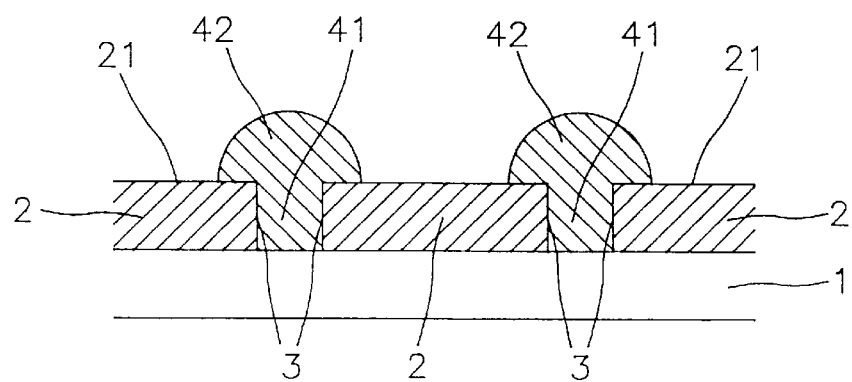

FIG. 3(c) includes a step of:

forming a second polysilicon layer having a thickness of about 500 Å to 5000 Å over the top surface of the polysilicon contact plug 41. The second polysilicon layer has a gibbous surface, and is formed by a selective growth of polysilicon at a temperature ranged from about 800° C. to 1000° C. and under a pressure of about 100 Pa. The selective growth of the polysilicon ensures that the second polysilicon layer 42 will not grow on the region 21 of the silicon dioxide 2.

Figure 3D:
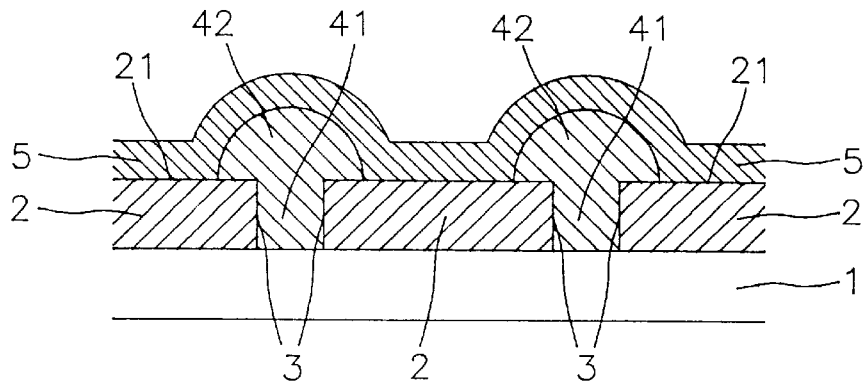

FIG. 3(d) includes a step of:

forming a third polysilicon layer 5 over the second polysilicon layer 42 and the region 21 of the oxide layer 2 by an LPCVD.

Figure 3E:
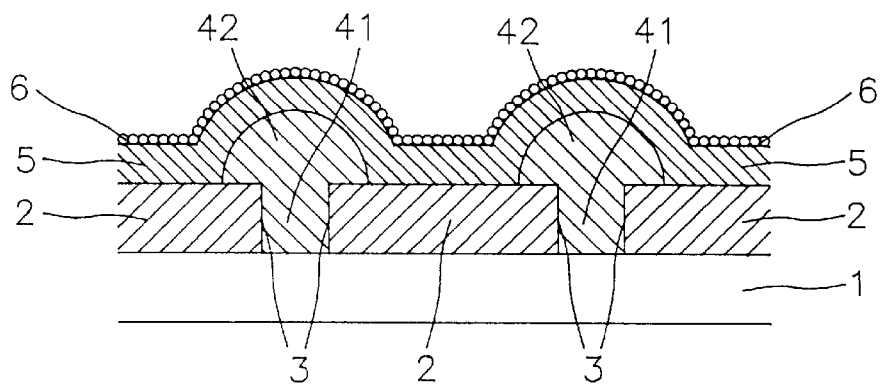

FIG. 3(e) includes a step of:

forming a rugged polysilicon layer 6 having a thickness of about 300 Å to 1000 Å over the third polysilicon layer 5 by an LPCVD at a temperature having a range from about 500° C. to 600° C.

Figure 3F:
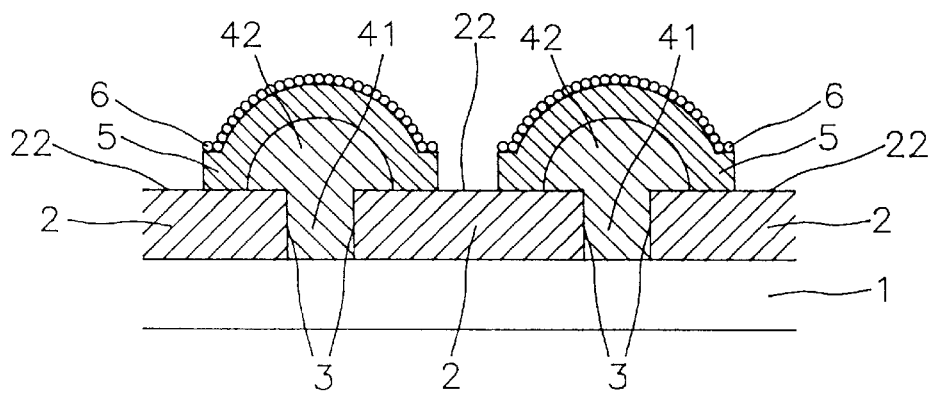

FIG. 3(f) includes steps of:

defining a stack-capacitor pattern on the rugged polysilicon layer by a photolithography technique; and etching the rugged polysilicon layer 6 and the third polysilicon layer 5 to expose the region 22 of the silicon dioxide 2. The gibbous surface of the polysilicon layer 42 will increase the surface area of the rugged polysilicon layer 5 and thus raise the capacitance of the stack capacitor.

It is obvious from the abovementioned preferred embodiments of the present invention that, a polysilicon layer having a gibbous surface can increase the surface area of a rugged polysilicon layer of a semiconductor device, and therefore is able to matain the capacitance of the stack capacitor constructed by the rugged polysilicon layer easily in a 0.38 μm or less wire size process. The capacitance of the stack capacitor can be adjusted according to the variation of the thickness of the gibbous polysilicon layer. That is to say, the capacitance of the stack capacitor can be adjusted to a required value in various applications.

Furthermore, because of the round-shaped edge of the gibbous polysilicon, and because of the thinner polysilicon layer between any two gibbous polysilicons, the probability of generating voids will be decreased when proceeding the planarization by deposing a dielectric layer, and a better effect of the planarization will be obtained.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A structure for increasing a capacitance of a stack capacitor on a silicon substrate comprising:

said silicon substrate;

an oxide layer formed on said silicon substrate and provided with a contact hole;

a first polysilicon layer forming a contact plug in said contact hole and having a gibbous surface of said contact plug; and a second polysilicon layer formed above said gibbous surface of said contact plug to form said stack capacitor, wherein said second polysilicon layer on said gibbous surface of said contact plug is a rugged polysilicon layer for increasing said capacitance of said stack capacitor.

2. A structure according to claim 1, wherein said oxide layer is a silicon dioxide layer.

3. A structure according to claim 1, wherein said gibbous surface of said contact plug has a thickness having a range from about 500 Å to 5000 Å.

4. A structure according to claim 1, wherein said second polysilicon layer has a thickness having a range from about 300 Å to about 1000 Å.

* * * * *